US012200964B2

United States Patent
Ge

(10) Patent No.: US 12,200,964 B2
(45) Date of Patent: Jan. 14, 2025

(54) DISPLAY PANEL COMPRISING BLACK MATRIX AND COLOR RESISTS ALONG WITH ANGLED LOW-REFRACTIVITY LAYER AND DISPLAY DEVICE COMPRISING THE SAME

(71) Applicant: WUHAN TIANMA MICRO-ELECTRONICS CO., LTD., Wuhan (CN)

(72) Inventor: Shucheng Ge, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 524 days.

(21) Appl. No.: 17/512,676

(22) Filed: Oct. 28, 2021

(65) Prior Publication Data
US 2022/0052298 A1    Feb. 17, 2022

(30) Foreign Application Priority Data
Aug. 13, 2021 (CN) .......................... 202110930074.5

(51) Int. Cl.
    *H10K 59/38*    (2023.01)
    *H10K 50/844*   (2023.01)
    *H10K 50/858*   (2023.01)
    *H10K 59/40*    (2023.01)

(52) U.S. Cl.
    CPC ......... *H10K 50/858* (2023.02); *H10K 50/844* (2023.02); *H10K 59/38* (2023.02); *H10K 59/40* (2023.02)

(58) Field of Classification Search
    CPC ...... H10K 50/858; H10K 59/38; H10K 59/40; H10K 59/879; H10K 50/844
    USPC ........................... 257/88; 438/22, 24, 46, 47
    See application file for complete search history.

(56) References Cited

U.S. PATENT DOCUMENTS

2020/0227489 A1*  7/2020  Kim ................... H10K 50/856
2021/0057678 A1*  2/2021  Motoyama ............ H10K 59/38
2021/0242433 A1*  8/2021  Xiao ................. H10K 59/8792

FOREIGN PATENT DOCUMENTS

CN          111446379 A1     7/2020

* cited by examiner

*Primary Examiner* — Didarul A Mazumder
(74) *Attorney, Agent, or Firm* — KILPATRICK TOWNSEND & STOCKTON LLP

(57) ABSTRACT

A display panel and a display device are provided. A first angle is configured to be different from the second angle, to optimize bottom angles of a low-refractivity layer at a first color resist and a second color resist that have different thicknesses, so that increments of light-emitting efficiency of the display panel at the first color resist and at the second color resist are substantially the same, to avoid color deviation in light-emitting when the display panel operates, improving the light-emitting effect of the display panel, and achieving a better display effect of the display panel.

20 Claims, 13 Drawing Sheets

DISPLAY PANEL COMPRISING BLACK MATRIX AND COLOR RESISTS ALONG WITH ANGLED LOW-REFRACTIVITY LAYER AND DISPLAY DEVICE COMPRISING THE SAME

CROSS REFERENCE OF RELATED APPLICATION

The present application claims the priority to Chinese Patent Application No. 202110930074.5, titled "DISPLAY PANEL AND DISPLAY DEVICE", filed on Aug. 13, 2021 with the State Intellectual Property Office of People's Republic of China, which is incorporated herein by reference in its entirety.

FIELD

The present disclosure relates to the field of display technology, and in particular to a display panel and a display device.

BACKGROUND

Compared with a liquid crystal display screen, an organic light-emitting display screen has advantages of lighter and thinner appearance, high brightness, low power consumption, fast response, high definition, good flexibility and high luminous efficiency, and thus gradually becomes the mainstream in the display screen. The light-emitting principle of the organic light-emitting display screen is that holes generated by an anode and electrons generated by a cathode in an organic light-emitting device move under action of an electric field into a hole transport layer and an electron transport layer respectively, then migrate to an organic light-emitting material layer. When the holes and the electrons meet in the organic light-emitting material layer, an energy exciton is produced to excite light-emitting molecules in the organic light-emitting material layer to produce visible light. The light-emitting effect of the conventional organic light-emitting display screen needs to be further improved.

SUMMARY

In view of this, a display panel and a display device are provided according to the present disclosure, which can effectively solve the problems in the conventional technology, improve light-emitting effect of the display panel, and achieve a better display effect of the display panel.

A display panel includes a filter layer and a low-refractivity layer.

The filter layer includes a black matrix and multiple color resists. The black matrix is provided with multiple first openings. The multiple color resists are respectively arranged in the multiple first openings. The multiple color resists include a first color resist and a second color resist which is of a color different from that of the first color resist. A thickness of the first color resist is greater than a thickness of the second color resist.

The low-refractivity layer is arranged on a side of the filter layer which faces away from the array substrate. The low-refractivity layer is provided with multiple second openings. The low-refractivity layer is in contact with the multiple color resists. The low-refractivity layer includes a first part that is overlapped with the first color resist and a second part that is overlapped with the second color resist. A bottom angle of the first part adjacent to the first color resist is a first angle. A bottom angle of the second part adjacent to the second color resist is a second angle. The first angle is different from the second angle.

In an embodiment, the display panel further includes an array substrate and a light-emitting unit layer arranged on the array substrate. The light-emitting unit layer includes a pixel definition layer and a plurality of light-emitting units, the pixel definition layer is provided with a plurality of pixel openings, and the plurality of light-emitting units are respectively arranged in the plurality of pixel openings. The filter layer is arranged on a side of the light-emitting unit layer which faces away from the array substrate, the low-refractivity layer is arranged on a side of the filter layer which faces away from the array substrate, and in a first direction, the pixel opening, the first opening and the second opening are overlapped with each other.

The first direction is perpendicular to the array substrate.

In addition, a display panel is further provided according to the present disclosure. The display panel includes an array substrate, a light-emitting unit layer, a filter layer and a low-refractivity layer.

The light-emitting unit layer is arranged on the array substrate. The light-emitting unit layer includes a pixel definition layer and multiple light-emitting units. The pixel definition layer is provided with multiple pixel openings. The multiple light-emitting units are respectively arranged in the multiple pixel openings.

The filter layer is arranged on a side of the light-emitting unit layer which faces away from the array substrate. The filter layer includes a black matrix and multiple color resists. The black matrix is provided with multiple first openings. The multiple color resists are respectively arranged in the multiple first openings. The multiple color resists include a first color resist and a second color resist which is of a color different from that of the first color resist. A thickness of the first color resist is greater than a thickness of the second color resist. A surface of the first color resist which faces away from the array substrate is aligned with a surface of the second color resist which faces away from the array substrate The low-refractivity layer is arranged on a side of the filter layer which faces away from the array substrate. The low-refractivity layer is provided with multiple second openings. The low-refractivity layer is in contact with the multiple color resists. In a first direction, the low-refractivity layer includes a first part that is overlapped with the first color resist and a second part that is overlapped with the second color resist. A bottom angle of the first part adjacent to the first color resist is a first angle. A bottom angle of the second part adjacent to the second color resist is a second angle. The first angle is equal to the second angle.

In the first direction, the pixel opening, the first opening and the second opening are overlapped with each other.

The first direction is perpendicular to the array substrate.

In addition, a display device is further provided according to the present disclosure. The display device includes the display panel described above.

A display panel and a display device are provided. A first angle is configured to be different from the second angle, to optimize bottom angles of a low-refractivity layer at a first color resist and a second color resist that have different thicknesses, so that increments of light-emitting efficiency of the display panel at the first color resist and at the second color resist are substantially the same, to avoid color deviation in light-emitting when the display panel operates, improving the light-emitting effect of the display panel, and achieving a better display effect of the display panel.

BRIEF DESCRIPTION OF THE DRAWINGS

In order to illustrate embodiments of the present disclosure more clearly, the drawings to be used in the description of the embodiments are briefly described below.

DETAILED DESCRIPTION

The embodiments of the present disclosure are described clearly and completely in conjunction with the drawings in the embodiments of the present disclosure hereinafter. It is apparent that the described embodiments are only some embodiments of the present disclosure, rather than all embodiments.

As described in the background section, compared with a liquid crystal display screen, an organic light-emitting display screen has advantages of lighter and thinner appearance, high brightness, low power consumption, fast response, high definition, good flexibility and high light-emitting efficiency, and thus gradually becomes the mainstream in the display technology. The light-emitting principle of the organic light-emitting display screen is that holes generated by an anode and electrons generated by a cathode in an organic light-emitting device move under action of an electric field into a hole transport layer and an electron transport layer respectively, then migrate to an organic light-emitting material layer. When the holes and the electrons meet in the organic light-emitting material layer, an energy exciton is produced to excite light-emitting molecules in the organic light-emitting material layer to produce visible light. The light-emitting effect of the conventional organic light-emitting display screen needs to be further improved.

Therefore, a display panel and a display device are provided according to the embodiments of the present disclosure, which can effectively solve the problems existing in the conventional technology, improve the light-emitting effect of the display panel, and ensure a good display performance of the display panel.

The embodiments of the present disclosure will be described on conjunction with FIGS. 1 to 21.

Figure 1:
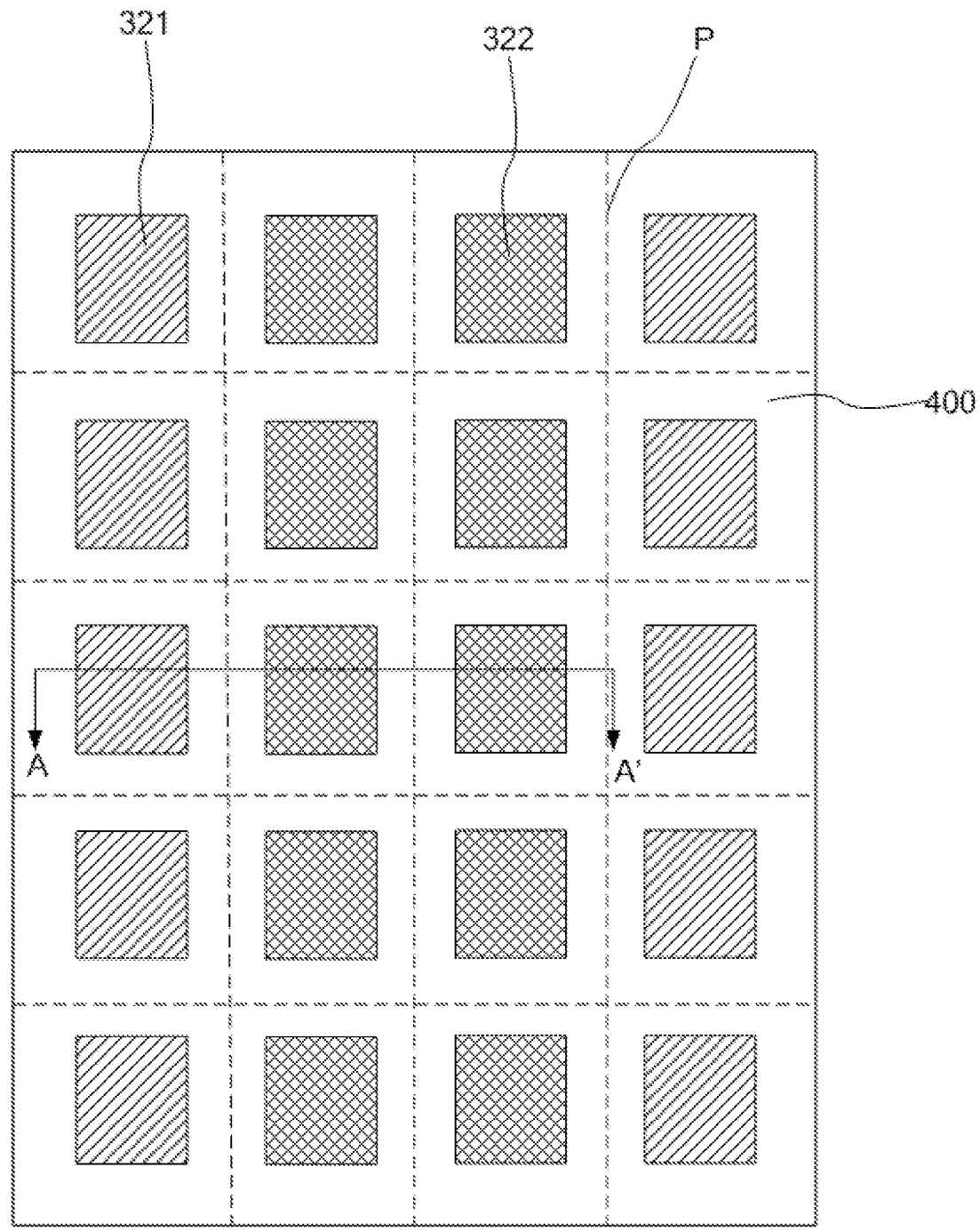
FIG. 1 is a top view of a display panel according to an embodiment of the present disclosure.
Figure 2:
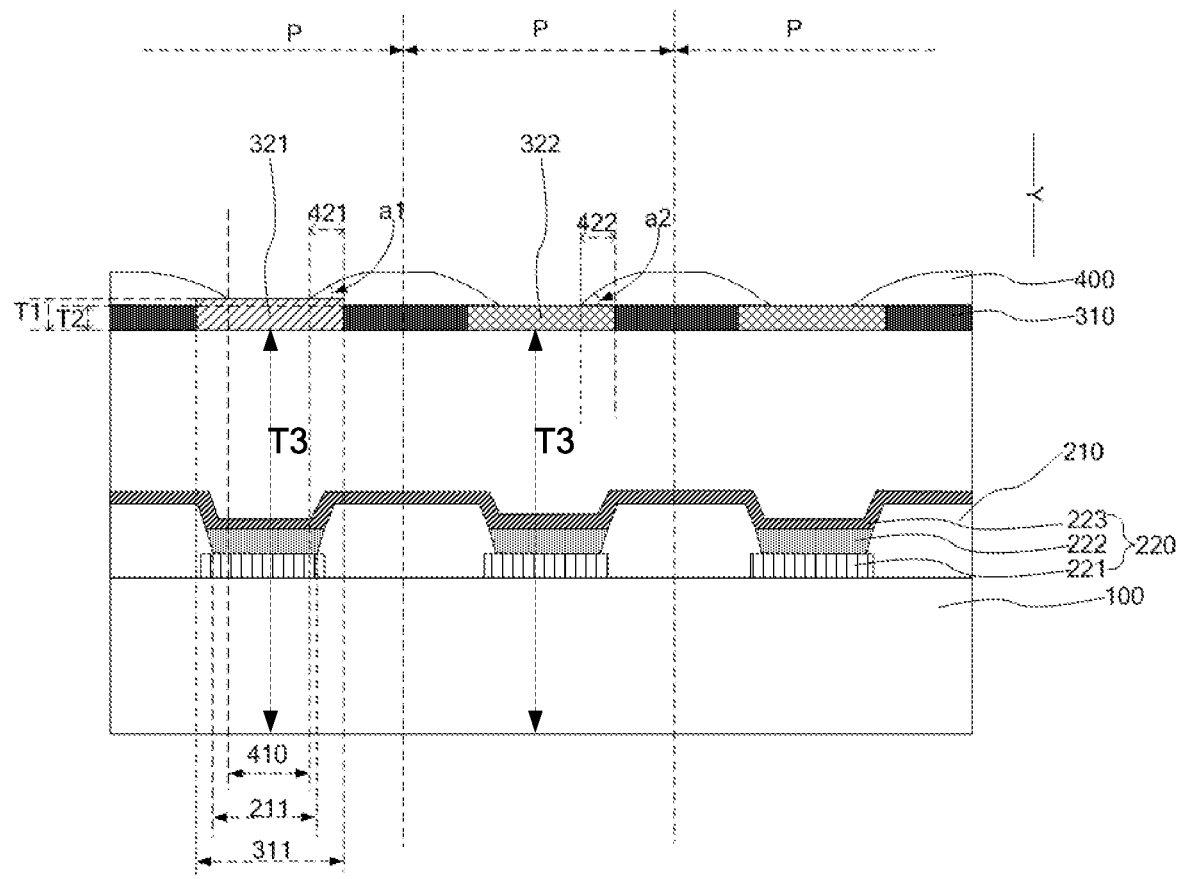
FIG. 2 is a sectional view taken along a line AA' in FIG. 1.

Reference is made to FIGS. 1 and 2. FIG. 1 is a top view of a display panel according to an embodiment of the present disclosure. FIG. 2 is a sectional view taken along a line AA' in FIG. 1. The display panel includes multiple pixels P. The multiple pixels P are arranged in an array. FIG. 1 is illustrated with 5 rows and 4 columns. The number and an arrangement of pixels included in the display panel may be determined according to the actual requirements. The display panel includes an array substrate 100, a light-emitting unit layer, a filter layer and a low-refractivity layer 400.

The light-emitting unit layer is arranged on the array substrate 100. The light-emitting unit layer includes a pixel definition layer 210 and multiple light-emitting units 220. The pixel definition layer 210 is provided with multiple pixel openings 211. The multiple light-emitting units 220 are respectively arranged in the multiple pixel openings 211.

The filter layer is arranged on a side of the light-emitting unit layer which faces away from the array substrate 100. The filter layer includes a black matrix 310 and multiple color resists. The black matrix 310 is provided with multiple first openings 311. The multiple color resists are respectively arranged in the multiple first openings 311. The multiple color resists include a first color resist 321 and a second color resist 322 which is of a color different from that of the first color resist 321. A thickness T1 of the first color resist 321 is greater than a thickness T2 of the second color resist 322.

The low-refractivity layer 400 is arranged on a side of the filter layer which faces away from the array substrate 100. The low-refractivity layer 400 is provided with multiple second openings 410. The low-refractivity layer 400 is in contact with the multiple color resists. In a first direction Y, the low-refractivity layer 400 includes a first part 421 that is overlapped with the first color resist 321 and a second part 422 that is overlapped with the second color resist 322. A bottom angle of the first part 421 adjacent to the first color resist 321 is a first angle a1. A bottom angle of the second part 422 adjacent to the second color resist 322 is a second angle a2. The first angle a1 is different from the second angle a2.

In the first direction Y, the pixel opening 211, the first opening 311 and the second opening 410 are overlapped with each other.

The first direction Y is perpendicular to a plane where the array substrate 100 is located.

It should be noted that a size of the first opening according to the embodiment of the present disclosure may be greater than a size of the pixel opening, that is, an orthographic projection of the first opening on a substrate covers an orthographic projection of the pixel opening on the substrate. In one embodiment, the size of the first opening is less than the size of the pixel opening, that is, the orthographic projection of the pixel opening on the substrate covers the orthographic projection of the first opening on the substrate. In one embodiment, the size of the first opening is the same as the size of the pixel opening, that is, the orthographic projection of the first opening on the substrate coincides with the orthographic projection of the pixel opening on the substrate.

In an embodiment of the present disclosure, the thickness of the first color resist according to the present disclosure is greater than a thickness of the black matrix, and the thickness of the second color resist may be equal to the thickness of the black matrix. In one embodiment, the thickness of the first color resist and the thickness of the second color resist according to an embodiment of the present disclosure each may be greater than the thickness of the black matrix.

It can be understood that the color resist according to the embodiment of the present disclosure is an element that allows a color of the color resist to pass while filters out other colors. For example, a blue color resist allows blue light to pass while filters out light of other colors. Since materials of color resists with different colors have different light transmittance, thicknesses of the color resists with different colors are set to be different. In the embodiment of the present disclosure, the thickness of the first color resist is set to be greater than the thickness of the second color resist, so that the display panel has a better light-emitting effect at the color resists. According to the embodiment of the present disclosure, the first color resist may be a red color resist and the second color resist may be at least one of a blue color resist and a green color resist. Only red light can pass through the red color resist, only blue light can pass through the blue color resist, and only green light can pass through the green color resist. The red color resist corresponds to a light-emitting unit called red light-emitting unit, the blue color resist corresponds to a light-emitting unit called blue light-emitting unit, and the green color resist corresponds to a light-emitting unit called green light-emitting unit. A thickness of the red color resist is greater than a thickness of the blue color resist, the thickness of the red color resist is greater than a thickness of the green color resist, and the thickness of the blue color resist may be equal to the thickness of the green color resist.

A distance T3 between a surface of the first color resist which is close to the array substrate and a plane where the array substrate is located may be substantially equal to a distance T3 between a surface of a second color resist which is close to the array substrate and the plane where the array substrate is located, referring to FIG. 2.

The thickness of the first color resist is different from the thickness of the second color resist. A surface of the first color resist which faces away from the array substrate is higher than a surface of the second color resist which faces away from the array substrate, that is, a distance (T1+T3) between the surface of the first color resist which faces away from the array substrate and the plane where the array substrate is located is greater than a distance (T2+T3) between the surface of the second color resist which faces away from the array substrate and the plane where the array substrate is located. Therefore, the thickness of the first part of the low-refractivity layer at the first color resist is different from the thickness of the second part of the low-refractivity layer at the second color resist, so that the low-refractivity layer improves the light-emitting efficiency at the first color resist with a degree different from that at the second color resist. In view of this, in an embodiment of the present disclosure, the first angle is configured to be different from the second angle, to optimize the bottom angles of the low-refractivity layer at the first color resist and the second color resist with different thicknesses, so that the increments of light-emitting efficiency of the display panel at the first color resist and at the second color resist are substantially the same (for example, a difference between the increments of light-emitting efficiency of the display panel at the first color resist and at the second color resist ranges from −1% to 1%, inclusive), to avoid color deviation in light-emitting when the display panel operates, improving the light-emitting effect of the display panel, and achieving a better display effect of the display panel.

Figure 3:
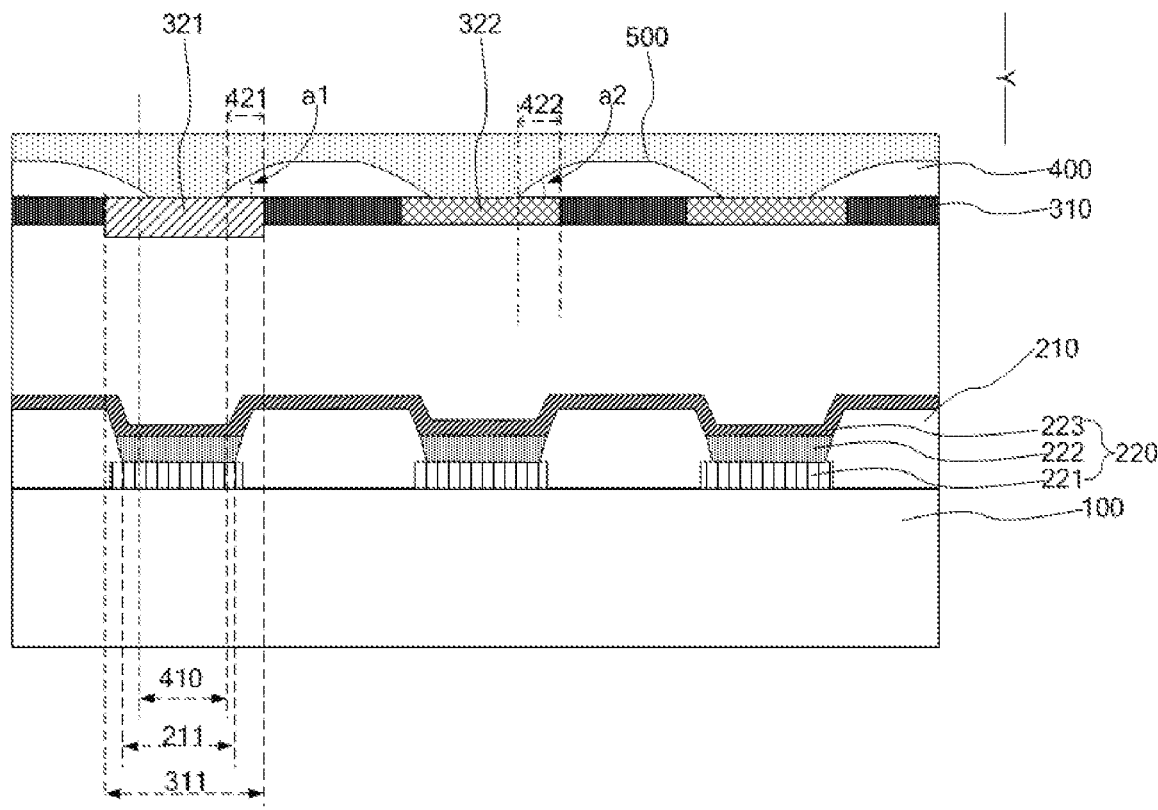
FIG. 3 is a schematic structural diagram of a display panel according to another embodiment of the present disclosure.

The display panel may further include a high-refractivity layer. The high-refractivity layer is arranged on a side of the low-refractivity layer which faces away from the array substrate. The high-refractivity layer covers the low-refractivity layer and is in contact with the low-refractivity layer. A refractive index of the high-refractivity layer is greater than a refractive index of the low-refractivity layer. FIG. 3 shows an arrangement of the high-refractivity layer. It can be understood that the arrangement of the high-refractivity layer may be combined with other drawings in any manner as long as the foregoing definition of the high-refractivity layer is met. For example, in FIG. 2, the high-refractivity layer can be arranged on a side of the low-refractivity layer 400 which faces away from the array substrate 100.

Reference is made to FIG. 3, which is a schematic structural diagram of a display panel according to another embodiment of the present disclosure. The display panel further includes a high-refractivity layer 500. The high-refractivity layer 500 is arranged on the side of the low-refractivity layer 400 which faces away from the array substrate 100. The high-refractivity layer 500 covers the low-refractivity layer 400 and is in contact with the low-refractivity layer 400.

A refractive index of the high-refractivity layer 500 is greater than a refractive index of the low-refractivity layer 400.

According to the embodiment of the present disclosure, the high-refractivity layer is arranged to cover the low-refractivity layer, further cover the second openings on the low-refractivity layer. As a result of the contact and cooperation of the high-refractivity layer with a large refractive index and the low-refractivity layer with a small refractive index, light emitted from the display panel at the color resists is guided, to improve the light-emitting efficiency of the display panel at the color resists.

As shown in FIG. 2 or 3, a part of the low-refractivity layer 400 adjacent to the second opening 410 includes an inclined part. The first part 421 and the second part 422 may constitute the inclined part of the low-refractivity layer 400. In a direction from the array substrate 100 to the light-emitting unit layer, an inclined surface of the first part 421 is inclined toward a direction away from the second opening 410, and an inclined surface of the second part 422 is inclined toward a direction away from the second opening 410. The thickness of the first color resist 321 is greater than the thickness of the second color resist 322 (where the thickness of the color resist is a thickness in the first direction Y), and a thickness of the first part 421 is less than a thickness of the second part 422, that is, a maximum thickness of the first part 421 in the first direction Y is less than a maximum thickness of the second part 422 in the first direction Y.

In an embodiment, in a case that the first color resist according to the embodiment of the present disclosure is the red color resist and the second color resists include the blue color resist and the green color resist, the thickness of the red color resist is greater than the thickness of the blue color resist, the thickness of the red color resist is greater than the thickness of the green color resist, and the thickness of the blue color resist may be the same as the thickness of the green color resist. A maximum thickness of the red color resist corresponding to the first part in the first direction is less than a maximum thickness of the blue color resist corresponding to the second part in the first direction. The maximum thickness of the red color resist corresponding to the first part in the first direction is less than a maximum thickness of the green color resist corresponding to the second part in the first direction. The maximum thickness of the blue color resist corresponding to the second part in the first direction is equal to the maximum thickness of the green color resist corresponding to the second part in the first direction.

In an embodiment of the present disclosure, in order to achieve substantial equal light-emitting efficiencies of the display panel at the first color resist and at the second color resist, the first angle and the second angle according to the embodiment of the present disclosure are required to satisfy the following requirements: the first angle is greater than the second angle, and the first angle is less than or equal to a boundary angle; the first angle is less than the second angle, and the first angle is greater than or equal to the boundary angle.

In other words, the bottom angle of the low-refractivity layer corresponding to the color resist with a larger thickness is closer to or equal to the boundary angle, and the bottom angle of the low-refractivity layer corresponding to the color resist with a smaller thickness is farther away from the boundary angle. That is, in a case that the first angle is less than or equal to the boundary angle, the first angle is greater than the second angle. In one embodiment, in a case that the first angle is greater than or equal to the boundary angle, the first angle is less than the second angle. The first angle and the second angle each ranges from 0° to 90°.

In an embodiment, in a case that the first color resist according to the embodiment of the present disclosure is the red color resist and the second color resists include the blue color resist and the green color resist, the thickness of the red color resist is greater than the thickness of the blue color resist, the thickness of the red color resist is greater than the thickness of the green color resist, and the thickness of the blue color resist may be the same as the thickness of the green color resist. In a case that the first angle corresponding to the red color resist is greater than or equal to the boundary angle, the second angle corresponding to the green color resist and the blue color resist each is greater than the first angle. In one embodiment, in a case that the first angle corresponding to the red color resist is less than or equal to the boundary angle, the second angle corresponding to the green color resist and the blue color resist is less than the first angle.

According to the embodiment of the present disclosure, in a case that a bottom angle of the low-refractivity layer adjacent to the color resist is equal to the boundary angle, the increment of light-emitting efficiency of the display panel at the color resist is at a maximum value. That is, the boundary angle is a parameter that enables the low-refractivity layer to maximize the light-emitting efficiency of the display panel at the color resist.

Figure 4:
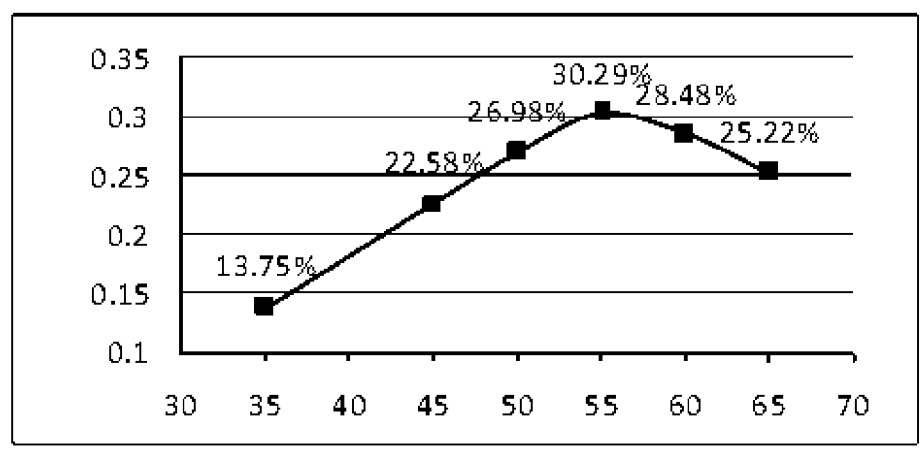
FIG. 4 is a schematic simulation diagram of light-emitting efficiency versus bottom angle according to an embodiment of the present disclosure.

FIG. 4 is a schematic simulation diagram of light-emitting efficiency versus a bottom angle according to an embodiment of the present disclosure. A horizontal ordinate represents a value of the bottom angle, and a vertical ordinate represents an increment of the light-emitting efficiency. In a case that a difference between a material refractive index of the high-refractivity layer and a material refractive index of the low-refractivity layer ranges from 0 to 0.2, for example, the material refractive index of the low-refractivity layer ranges from 1.45 to 1.55, and the material refractive index of the high-refractivity layer ranges from 1.65 to 1.75, the increment of the light-emitting efficiency is the maximum when the bottom angle is equal to about 55°. The light-emitting efficiency increases with the increase of the bottom angle when the bottom angle is less than 55°. The light-emitting efficiency decreases as the bottom angle increases when the bottom angle is greater than 55°.

The boundary angle according to the embodiment of the present disclosure may be equal to 55°.

In a case that the difference between the material refractive index of the high-refractivity layer and the material refractive index of the low-refractivity layer is greater than 0.2, the greatest increment of the light-emitting efficiency corresponds to a bottom angle that is less than 55°. The boundary angle may be determined according to the difference between the refractive index of the high-refractivity layer and the refractive index of the low-refractivity layer.

Figure 5:
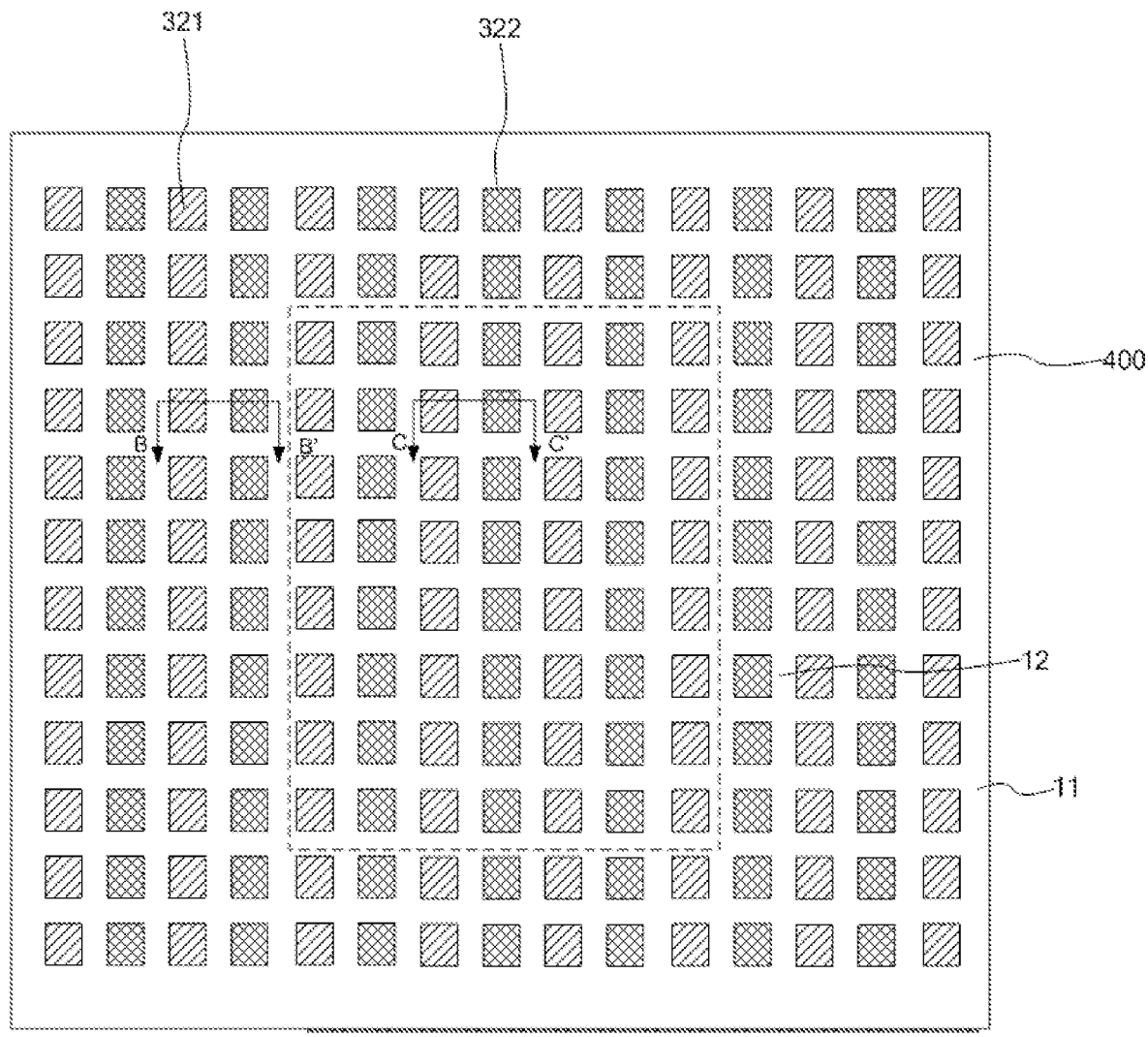
FIG. 5 is a schematic structural diagram of a display panel according to another embodiment of the present disclosure.
Figure 6:
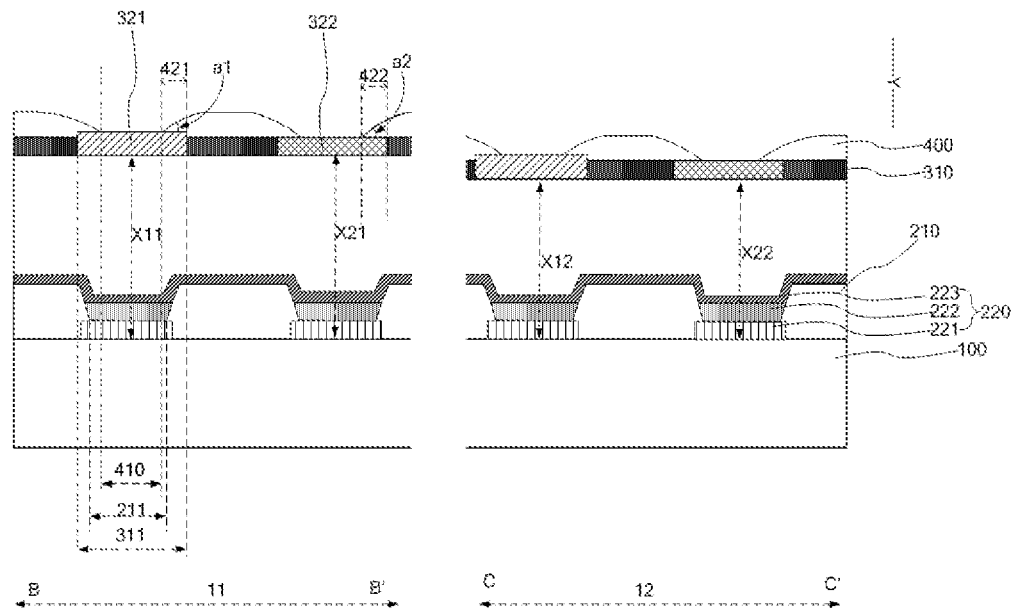
FIG. 6 is a schematic structural diagram of a display panel according to another embodiment of the present disclosure.

As shown in FIGS. 5 and 6, FIG. 5 is a schematic structural diagram of a display panel according to another embodiment of the present disclosure, and FIG. 6 is a sectional view taken along lines BB' and CC' in FIG. 5. The display panel according to the present disclosure includes a display region (no reference numeral is provided). The display region includes a first area 11 and a second area 12.

The positions of the first area 11 and the second area 12 in the display region are described as follows. The first area 11 may be arranged at a position of the display region near an edge of the display region, and the second area 12 may be arranged in an portion of the display region other than the first area 11. For example, the first area 11 is arranged near one side edge, two side edges or three side edges (such as one, two or three of the left side, the right side, the upper side and the lower side in FIG. 5) of the display region. In one embodiment, the first area 11 surrounds the second area 12 (as shown in FIG. 5).

The second area 12 may be arranged at a position of the display region near an edge of the display region. The first area 11 may be arranged in a portion of the display region other than the second area 12.

The first area 11 and the second area 12 may be located otherwise in the display region.

It should be noted that the number of pixels in the first area 11 and the number of pixels in the second area 12 as shown in FIG. 5 are schematic, and the numbers of pixels in the first area 11 and the second area 12 may be determined according to the actual requirements.

Referring to FIGS. 5 and 6, a distance X11 from a surface of one first color resist 321 in the first area 11 facing the light-emitting unit layer to a horizontal plane (which may be a surface of the anode 221 facing towards a substrate layer 110) where a surface of the light-emitting unit layer is located is greater than a distance X12 from a surface of one first color resist 321 in the second area 12 facing the light-emitting unit layer to the horizontal plane. A distance X21 from a surface of one second color resist 322 arranged in the first area 11 facing the light-emitting unit layer to the horizontal plane is greater than a distance X22 from a surface of one second color resist 322 arranged in the second area 12 facing the light-emitting unit layer to the horizontal plane. A thickness of at least one first color resist 321 arranged in the first area 11 is less than a thickness of at least one first color resist 321 arranged in the second area 12, and a thickness of at least one second color resist 322 arranged in the first area 11 is less than a thickness of at least one second color resist 322 arranged in the second area 12.

Figure 7:
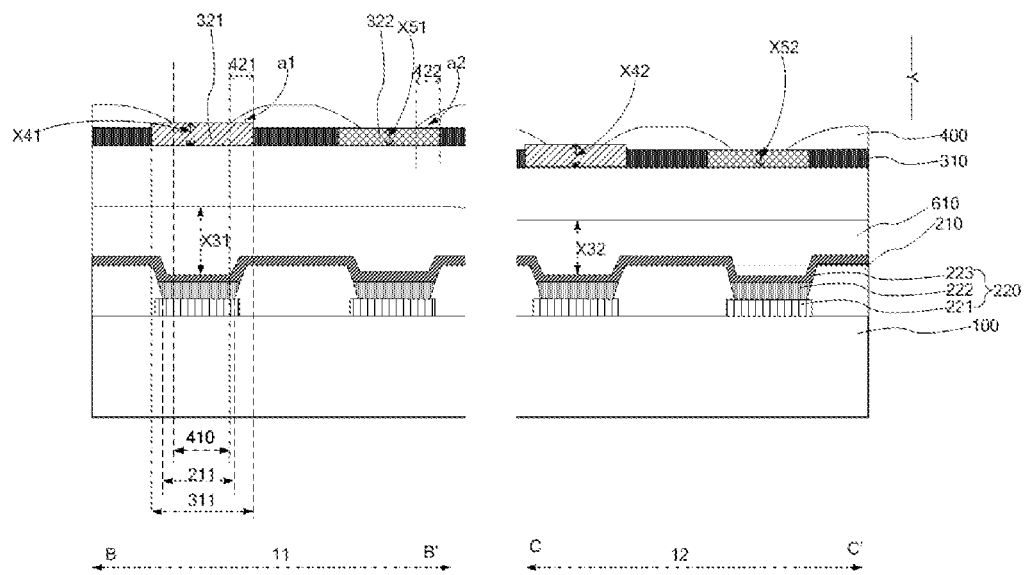
FIG. 7 is a schematic structural diagram of a display panel according to another embodiment of the present disclosure.

FIG. 7 is a sectional view taken along lines BB' and CC' in FIG. 5.

The display panel further includes a thin film packaging layer 610. The thin film packaging layer 610 is arranged between the light-emitting unit layer and the filter layer. A thickness X31 of the thin film packaging layer 610 in the first area 11 is greater than a thickness X32 of the thin film packaging layer 610 in the second area 12. A thickness X41 of one first color resist 321 arranged in the first area 11 is less than a thickness X42 of one first color resist 321 arranged in the second area 12. A thickness X51 of one second color resist 322 arranged in the first area 11 is less than a thickness X52 of one second color resist 322 arranged in the second area 12.

For example, a part of the thin film packaging layer in the first area is in a convex shape which protrudes away from the light-emitting unit layer. A width of the convex part (that is, a width of the first area) covers multiple light-emitting units. Due to the convex part of the thin film packaging layer in the first area, a film layer (such as a film layer arranged between the thin film packaging layer and the filter layer) arranged on the thin film packaging layer has a higher part in the first area and a lower part in the second area, and the thickness of the color resists in the first area is less than that in the second area.

In an embodiment of the present disclosure, in the first area, the first angle and the second angle satisfy that: the first angle is greater than the second angle, and the first angle is less than or equal to the boundary angle; or the first angle is less than the second angle, and the first angle is greater than or equal to the boundary angle.

In addition, in the second area, the first angle and the second angle satisfy that: the first angle is greater than the second angle, and the first angle is less than or equal to the boundary angle; or, the first angle is less than the second angle, and the first angle is greater than or equal to the boundary angle.

In addition, in the first area, an absolute value of a difference between the first angle and the boundary angle is a first difference. In the second area, an absolute value of a difference between the first angle and the boundary angle is a second difference. The first difference is greater than the second difference.

In the display panel according to the embodiment of the present disclosure, a layer structure arranged between the filter layer and the light-emitting unit layer has parts with different thicknesses, so that the display panel includes a first area and a second area, and the layer structure between the filter layer and the light-emitting unit layer has a greater thickness in the first area than in the second area. Further, a surface of a first color resist arranged in the first area close to the array substrate is higher than a surface of a first color resist arranged in the second area close to the array substrate, and a surface of a second color resist arranged in the first area close to the array substrate is higher than a surface of a second color resist arranged in the second area close to the array substrate. According to the embodiment of the present disclosure, the first angle and the second angle are optimized, so that in the first area the increment of light-emitting efficiency of the display panel at the first color resist is substantially the same as that at the second color resist, and in the second area the increment of light-emitting efficiency of the display panel at the first color resist is substantially the same as that at the second color resist.

In addition, the thickness of the color resists arranged in the first area is less than the thickness of the color resists arranged in the second area, so that light transmittance of the color resists arranged in the first area is greater than light transmittance of the color resists arranged in the second area, and light that is emitted by the light-emitting units in the first area and passes through the color resists has greater brightness than the light that is emitted by the light-emitting units in the second area and passes through the color resists. According to the embodiment of the present disclosure, the first angle and the second angle in different areas are optimized, so that the increment of light-emitting efficiency of the display panel at the first color resists in the first area is lower than the increment of light-emitting efficiency of the display panel at the first color resists in the second area, and the increment of light-emitting efficiency of the display panel at the second color resists in the first area is lower than the increment of light-emitting efficiency of the display panel at the second color resists in the second area, to ensure a consistent light-emitting effect of the display panel in the first area and the second area and avoiding brightness difference.

In other words, in a case that the first angle according to the embodiment of the present disclosure is less than the boundary angle, the first angle in the first area is less than the first angle in the second area. In one embodiment, in a case that the first angle is greater than the boundary angle, the first angle in the first area is greater than the first angle in the second area, so that the increment of light-emitting efficiency of the display panel at the first color resist in the first area is less than at the first color resist in the second area. In addition, in a case that the second angle according to the embodiment of the present disclosure is less than the boundary angle, the second angle in the first area is less than the second angle in the second area. In one embodiment, in a case that the second angle is greater than the boundary angle, the second angle in the first area is greater than the second angle in the second area, so that the increment of light-emitting efficiency of the display panel at the second color resist in the first area is less than at the second color resist in the second area.

Figure 8:
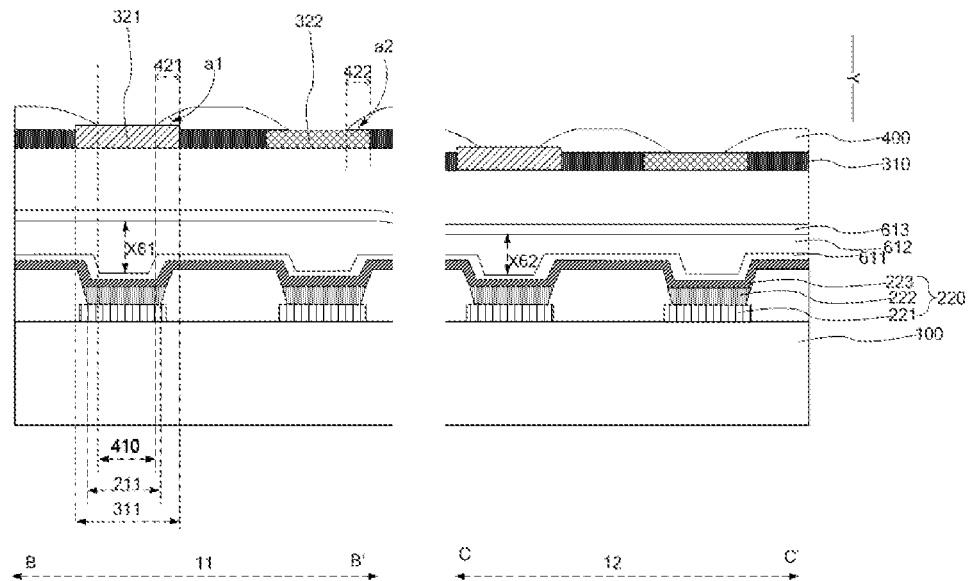
FIG. 8 is a schematic structural diagram of a display panel according to another embodiment of the present disclosure.

For the structure of the thin film packaging layer 610, reference may be made to FIG. 8. In a direction from the array substrate 100 to the filter layer, the thin film packaging layer 610 sequentially includes a first inorganic layer 611, an organic layer 612 and a second inorganic layer 613. A thickness X61 of a part of the organic layer 612 located in the first area 11 is greater than a thickness X62 of a part of the organic layer 612 located in the second area 12. The first organic layer, having different thicknesses in the first area and the second area, may be formed by adjusting contents of compound in printing or adjusting a printing duration.

Figure 9:
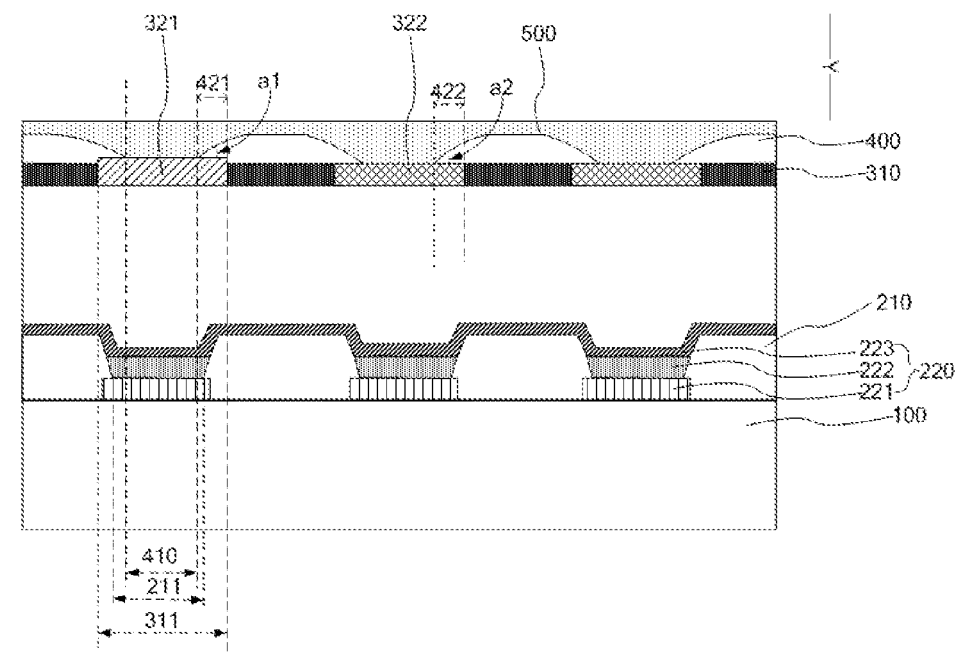
FIG. 9 is a schematic structural diagram of a display panel according to another embodiment of the present disclosure.

Reference is made to FIG. 9, which is a schematic structural diagram of a display panel according to another embodiment of the present disclosure. The display panel includes an array substrate 100, a light-emitting unit layer, a filter layer and a low-refractivity layer 400.

The light-emitting unit layer is arranged on the array substrate 100. The light-emitting unit layer includes a pixel definition layer 210 and multiple light-emitting units 220. The pixel definition layer 210 is provided with multiple pixel openings 211. The multiple light-emitting units 220 are respectively arranged in the multiple pixel openings 211.

The filter layer is arranged on a side of the light-emitting unit layer which faces away from the array substrate 100. The filter layer includes a black matrix 310 and multiple color resists. The black matrix 310 is provided with multiple first openings 311. The multiple color resists are respectively arranged in the multiple first openings 311. The multiple color resists include a first color resist 321 and a second color resist 322 which is of a color different from that of the first color resist 321. A thickness of the first color resist 321 is greater than a thickness of the second color resist 322.

The low-refractivity layer 400 is arranged on a side of the filter layer which faces away from the array substrate 100. The low-refractivity layer 400 is provided with multiple second openings 410. The low-refractivity layer 400 is in contact with the multiple color resists. In a first direction Y, the low-refractivity layer 400 includes a first part 421 that is overlapped with the first color resist 321 and a second part 422 that is overlapped with the second color resist 322. A bottom angle of the first part 421 adjacent to the first color resist 321 is a first angle a1. A bottom angle of the second part 422 adjacent to the second color resist 322 is a second angle a2. The first angle a1 is different from the second angle a2.

In the first direction Y, the pixel opening 211, the first opening 311 and the second opening 410 are overlapped with each other. The first direction Y is perpendicular to a plane where the array substrate 100 is located.

In addition, an outer insulation layer 700 is arranged between the light-emitting unit layer and the filter layer. The outer insulation layer 700 includes a convex part 710 corresponding to the second color resist 322.

Figure 10:
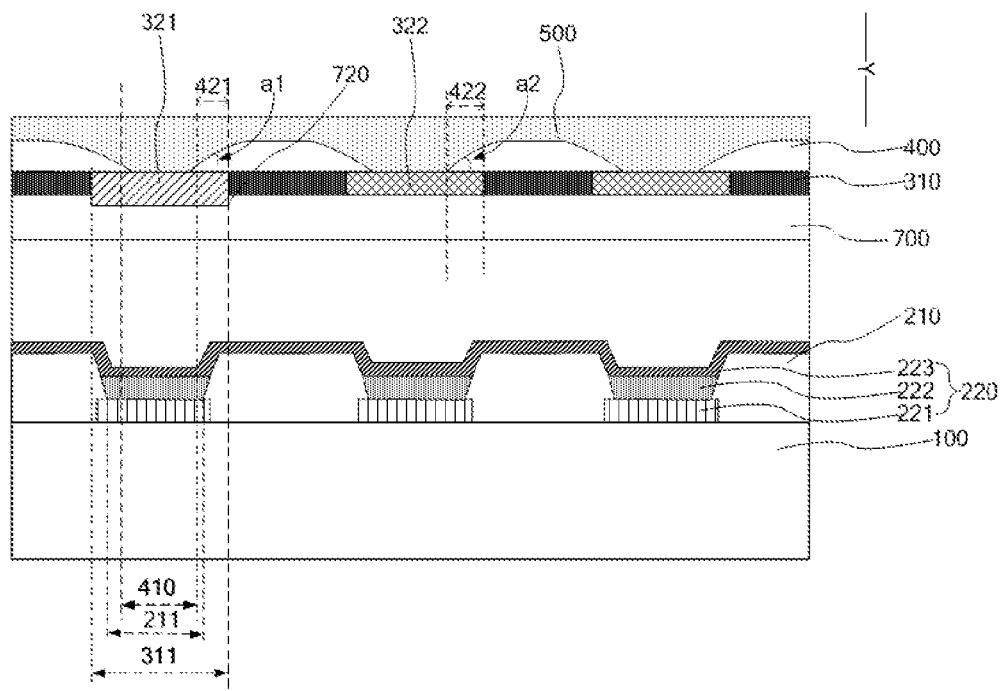
FIG. 10 is a schematic structural diagram of a display panel according to another embodiment of the present disclosure.

In one embodiment, reference is made to FIG. 10, which is a schematic structural diagram of a display panel according to another embodiment of the present disclosure. In the display panel, the outer insulation layer 700 includes a concave part 720 corresponding to the first color resist 321.

In one embodiment, reference is made to FIG. 8, which is a schematic structural diagram of a display panel according to another embodiment of the present disclosure. In the display panel, the outer insulation layer 700 includes the convex part 710 corresponding to the second color resist 322 and the concave part 720 corresponding to the first color resist 321.

It can be understood that according to the embodiment of the present disclosure, the outer insulation layer is provided with a concave part corresponding to the first color resist and/or a convex part corresponding to the second color resist, to reduce a height of a surface of the first color resist facing away from the array substrate, and/or increase a height of a surface of the second color resist facing away from the array substrate, so that the surface of the second color resist facing away from the array substrate is substantially aligned with or exactly aligned with the surface of the first color resist facing away from the array substrate. The first angle and the second angle are optimized in a way that the first angle is greater than the second angle and the first angle is less than or equal to the boundary angle, or the first angle is less than the second angle and the first angle greater than or equal to the boundary angle. Therefore, the increment of light-emitting efficiency of the display panel at the first color resist and the increment of light-emitting efficiency of the display panel at the second color resist are substantially the same, to avoid color deviation in light-emitting when the display panel operates, improving the light-emitting effect of the display panel, and achieving a better display effect of the display panel.

In an embodiment of the present disclosure, a surface of the first color resist which faces away from the array substrate is aligned with a surface of the second color resist which faces away from the array substrate.

Figure 11:
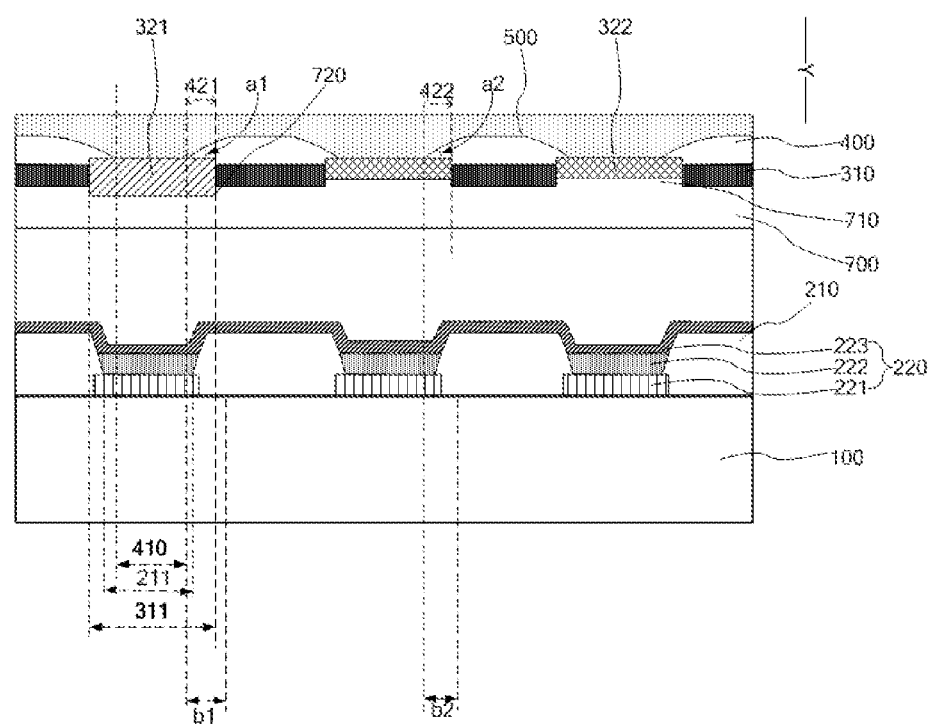
FIG. 11 is a schematic structural diagram of a display panel according to another embodiment of the present disclosure.

Reference is made to FIG. 11, which is a schematic structural diagram of a display panel according to another embodiment of the present disclosure. The display panel includes a thin film packaging layer 610, a touch electrode layer 620 and an outer insulation layer 700. The thin film packaging layer 610 is arranged between the light-emitting unit layer and the filter layer. The touch electrode layer 620 is arranged on a side of the thin film packaging layer 610 which faces away from the array substrate 100. The touch electrode layer 620 includes multiple touch electrodes. The outer insulation layer 700 is arranged on a side of the touch electrode layer 620 which faces away from the array substrate.

Figure 12:
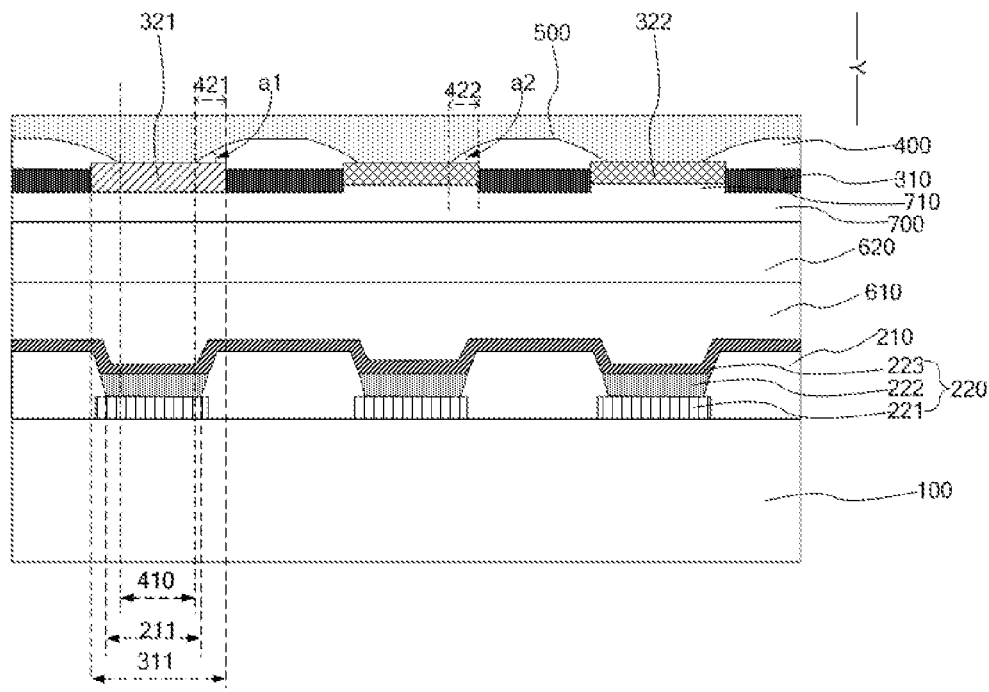
FIG. 12 is a schematic structural diagram of a display panel according to another embodiment of the present disclosure.

It should be noted that a touch structure according to the embodiment of the present disclosure may be a single-layer touch structure, that is, the touch electrodes included in the touch electrode layer and leads of the touch electrodes are arranged in a same layer. In such case, the convex part and the concave part are correspondingly arranged on the outer insulation layer only. As shown in FIG. 12, the convex part 710 corresponding to the second color resist 322 is arranged on the outer insulation layer 700 only.

Figure 13:
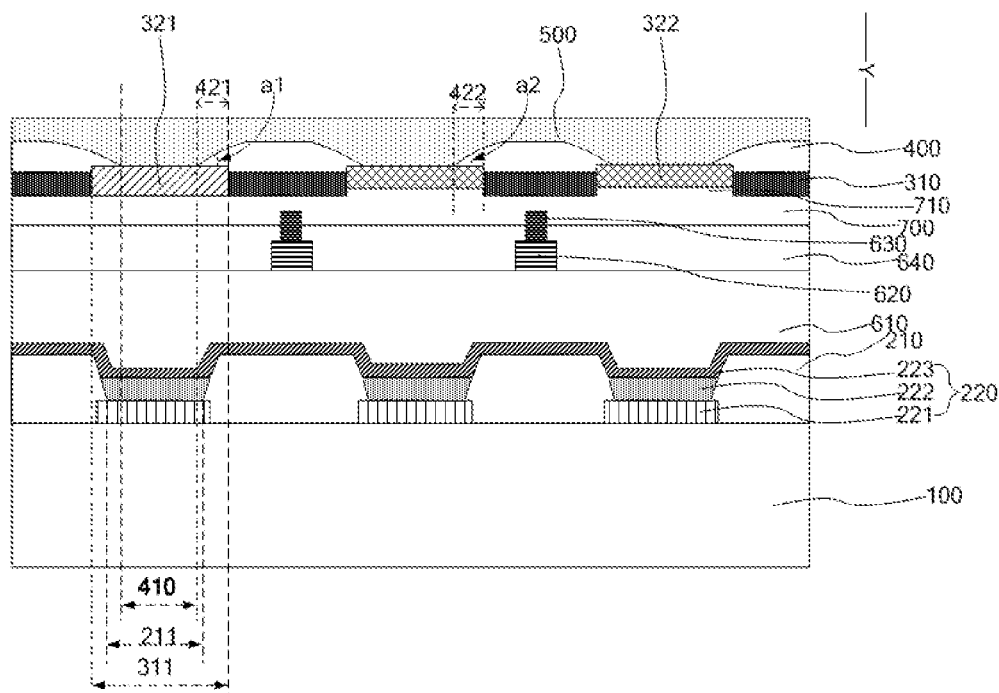
FIG. 13 is a schematic structural diagram of a display panel according to another embodiment of the present disclosure.

In one embodiment, the touch structure according to the embodiment of the present disclosure may be a double-layer touch structure, that is, the touch electrode layer only includes the touch electrodes, and the leads of the touch electrodes are arranged in a wiring layer different from a layer where the touch electrodes are arranged. In such case, the convex part and the concave part may be correspondingly arranged on the outer insulation layer only, and a spacing insulation layer arranged between the wiring layer and the touch electrode layer has no arrangement of a convex part and a concave part. In one embodiment, the convex part and the concave part may be correspondingly arranged on the outer insulation layer, and the spacing insulation layer arranged between the wiring layer and the touch electrode layer is also provided with a convex part and a concave part. The present disclosure is not limited in this aspect. Reference is made to FIG. 13, which is a schematic structural diagram of a display panel according to another embodiment of the present disclosure. The display panel includes a thin film packaging layer 610, a touch electrode layer 620, a wiring layer 630, a spacing insulation layer 640 and an outer insulation layer 700. The thin film packaging layer 610 is arranged between the light-emitting unit layer and the filter layer. The touch electrode layer 620 is arranged on a side of the thin film packaging layer 610 which faces away from the array substrate 100. The touch electrode layer 620 includes multiple touch electrodes. The wiring layer 630 is arranged in a layer different from a layer where the touch electrode layer 620 is arranged. The wiring layer includes leads connected with the touch electrodes. The spacing insulation layer 640 is arranged between the touch electrode layer 620 and the wiring layer 630. The outer insulation layer 700 is arranged on a side of the touch electrode layer 620 which faces away from the array substrate.

Figure 14:
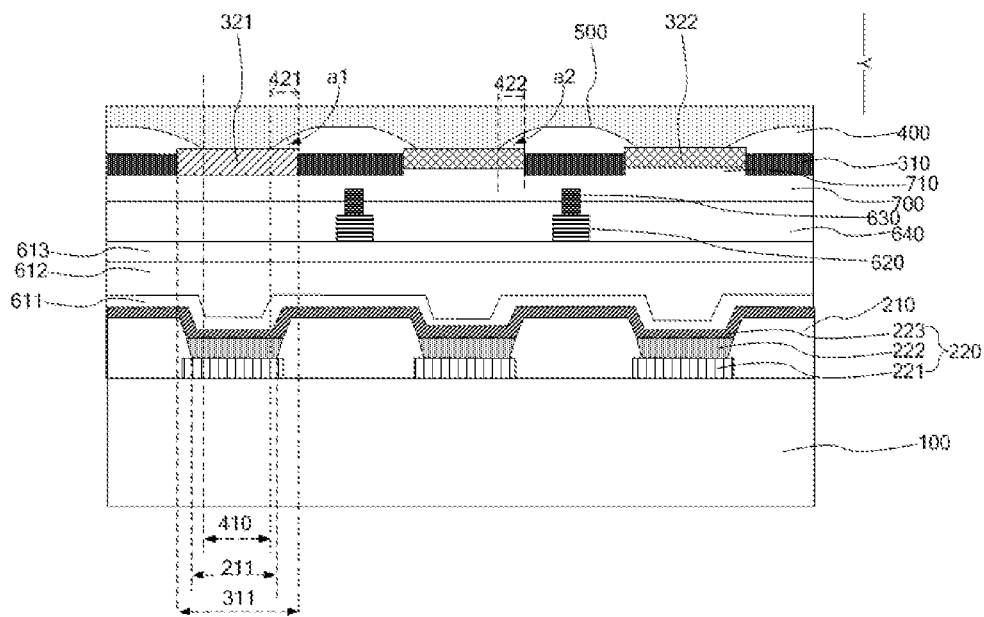
FIG. 14 is a schematic structural diagram of a display panel according to another embodiment of the present disclosure.

Reference is made to FIG. 14, which is a schematic structural diagram of a display panel according to another embodiment of the present disclosure. The thin film packaging layer according to the embodiment of the present disclosure includes a first inorganic layer 611, an organic layer 612 and a second inorganic layer 613 that are stacked sequentially in a direction from the array substrate 100 to the filter layer. The thin film packaging layer with the stacked structure is arranged to improve the packaging effect.

Figure 15:
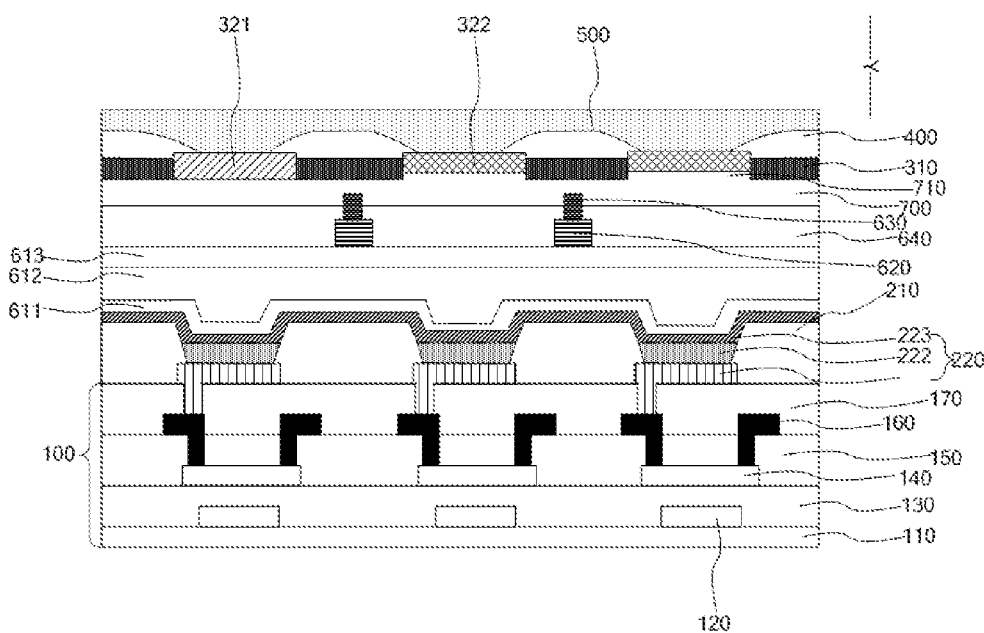
FIG. 15 is a schematic structural diagram of a display panel according to another embodiment of the present disclosure.

Reference is made to FIG. 15, which is a schematic structural diagram of a display panel according to another embodiment of the present disclosure. The array substrate 100 according to the embodiment of the present disclosure includes: a substrate layer 110; a first metal layer 120 arranged on a side of the substrate layer 110 which faces towards the light-emitting unit layer, where the first metal layer 120 includes a gate; a first insulation layer 130 arranged on a side of the first metal layer 120 which faces away from the substrate layer 110; a semiconductor layer 140 arranged on a side of the first insulation layer 130 which faces away from the substrate layer 110, where the semiconductor layer 140 includes an active region; a second insulation layer 150 arranged on a side of the semiconductor layer 140 which faces away from the substrate layer 110; a second metal layer 160 arranged on a side of the second insulation layer 150 which faces away from the substrate layer 110, where the second metal layer 160 includes a first electrode, a second electrode that are in contact with the active region through via-holes; and a planarization layer 170 arranged on a side of the second metal layer 160 which faces away from the substrate layer 110. The gate, the active region, the first electrode and the second electrode form a transistor. A driving circuit formed by the transistor is electrically connected with the light-emitting unit 220 for driving the light-emitting unit 220 to emit light.

Figure 16:
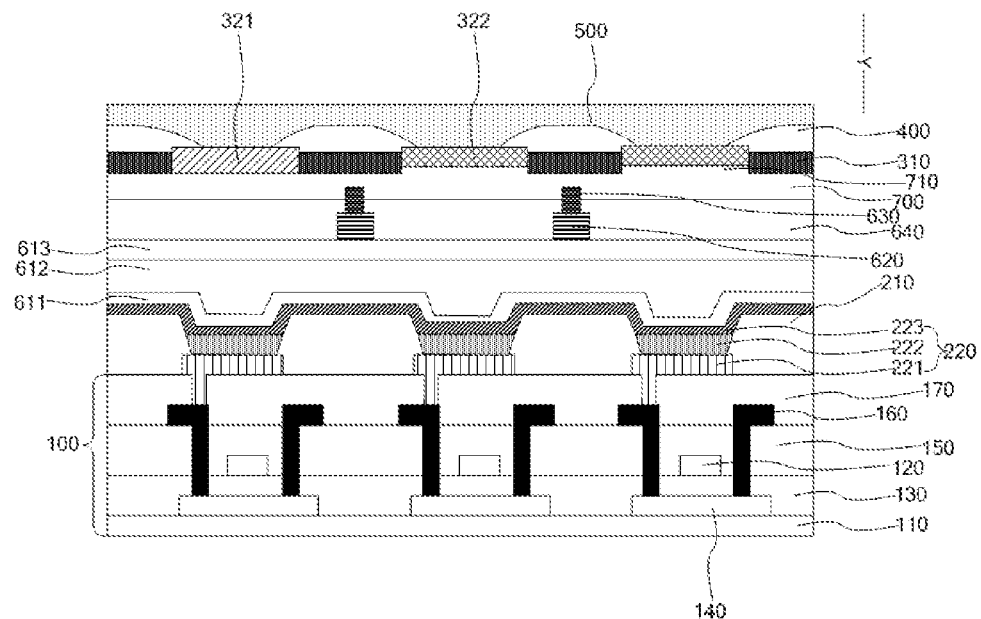
FIG. 16 is a schematic structural diagram of a display panel according to another embodiment of the present disclosure.

In one embodiment, the gate of the transistor according to the embodiment of the present disclosure may be arranged on a side of the semiconductor layer which faces away from the substrate layer. Reference is made to FIG. 16, which is a schematic structural diagram of a display panel according to another embodiment of the present disclosure. The array substrate 100 according to the embodiment of the present disclosure includes: a substrate layer 110; a semiconductor layer 140 arranged on a side of the substrate layer 110 which faces towards the light-emitting unit layer, where the semiconductor layer 140 includes an active region; a first insulation layer 130 arranged on a side of the semiconductor layer 140 which faces away from the substrate layer 110; a first metal layer 120 arranged on a side of the first insulation layer 130 which faces away from the substrate layer 110, where the first metal layer 120 a gate; a second insulation layer 150 arranged on a side of the first metal layer 120 which faces away from the substrate layer 110; a second metal layer 160 arranged on a side of the second insulation layer 150 which faces away from the substrate layer 110, where the second metal layer 160 includes a first electrode and a second electrode, and the first electrode and the second electrode are in contact with the active region through via-holes; and a planarization layer 170 arranged on a side of the second metal layer 160 which faces away from the substrate layer 110. The gate, the active region, the first electrode and the second electrode form a transistor. A driving circuit formed by the transistor is electrically connected with the light-emitting unit 220 for driving the light-emitting unit 220 to emit light.

In order to further optimize the structure of the display panel, the display panel according to the embodiment of the present disclosure may be further provided with a buffer layer between the thin film packaging layer and the touch structure. In one embodiment, other structure is arranged, which is not limited in the present disclosure.

The light-emitting unit according to the embodiment of the present disclosure may include a stack of an anode, a light-emitting layer and a cathode. As shown in FIG. 16, the light-emitting unit according to the embodiment of the present disclosure includes an anode 221 connected with a transistor, a light-emitting layer 222 arranged on a side of the anode 221 which faces away from the substrate layer 110, and a cathode 223 arranged on a side of the light-emitting layer 222 which faces away from the substrate layer 110. The cathode 223 may have a structure of an entire surface which covers the pixel definition layer 210, which is not limited in the present disclosure.

Figure 17:
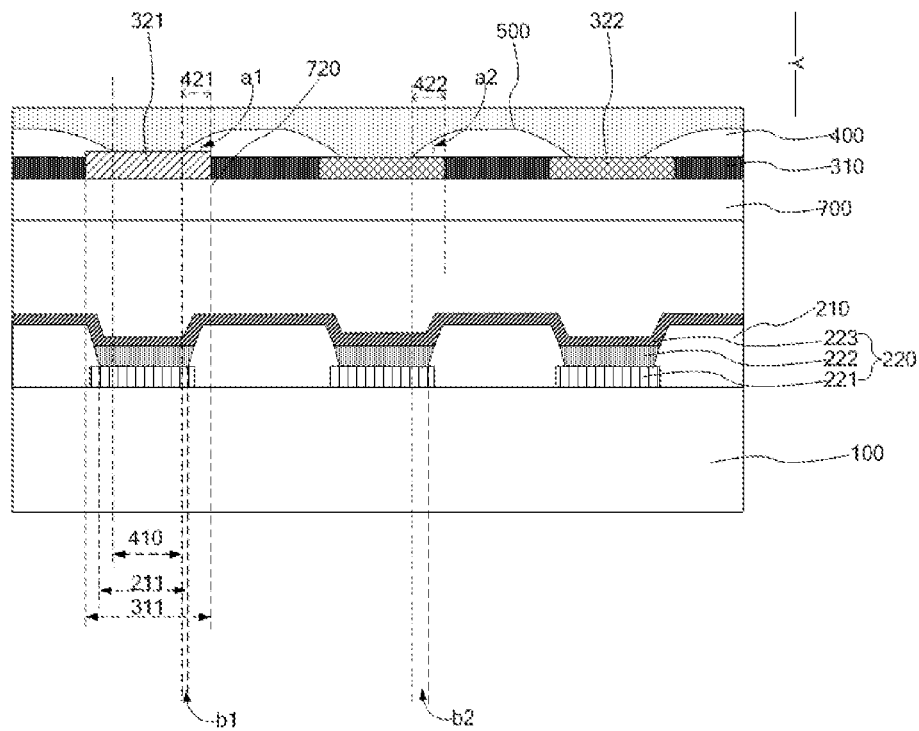
FIG. 17 is a schematic structural diagram of a display panel according to another embodiment of the present disclosure.

Reference is made to FIG. 17, which is a schematic structural diagram of a display panel according to another embodiment of the present disclosure. In the display panel, a spacing between a contour line of an orthographic projection of the second opening 410 on the array substrate 100 and a contour line of an orthographic projection of the pixel opening 211 on the array substrate is a reference spacing. The reference spacing corresponding to the first part 421 is a first reference spacing b1. The reference spacing corresponding to the second part 422 is a second reference spacing b2. The first reference spacing b1 is different from the second reference spacing b2.

Figure 18:
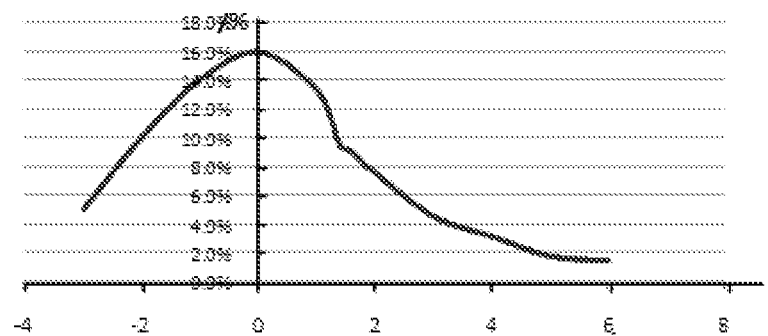
FIG. 18 is a schematic simulation diagram of light-emitting efficiency versus reference spacing according to an embodiment of the present disclosure.

It can be understood that according to the embodiment of the present disclosure, the increment of light-emitting efficiency of the display panel at the color resist changes with the reference spacing between the orthographic projection of the contour line of the second opening on the array substrate and the orthographic projection of the contour line of the pixel opening on the array substrate. The increment of light-emitting efficiency of the display panel at the color resist is increased as the reference spacing decreases. Therefore, the first reference spacing is set to be different from the second reference spacing, and the first angle is set to be different from the second angle, so that the increment of light-emitting efficiency of the display panel at the first color resist and the increment of light-emitting efficiency of the display panel at the second color resist are substantially the same. Reference is made to FIG. 18, which is schematic simulation diagram of light-emitting efficiency versus reference space according to an embodiment of the present disclosure. A horizontal ordinate represents a value of the reference spacing, and a vertical ordinate represents an increment of the light-emitting efficiency. It can be seen that the increment of light-emitting efficiency of the display panel at the color resist increases as an absolute value of the reference spacing decreases.

In an embodiment of the present disclosure, the first reference spacing is less than the second reference spacing. In an embodiment, in a case that the first color resist according to the embodiment of the present disclosure is the red color resist, the second color resists include the blue color resist and the green color resist, the thickness of the red color resist is greater than the thickness of the blue color resist, the thickness of the red color resist is greater than the thickness of the green color resist, and the thickness of the blue color resist is the same as that of the green color resist, a first reference spacing corresponding to the red color resist is less than a second reference spacing corresponding to the blue color resist, the first reference spacing corresponding to the red color resist is less than a second reference spacing corresponding to the green color resist, and a first reference spacing corresponding to the blue light color resist is equal to the second reference spacing corresponding to the green light color resist.

Figure 19:
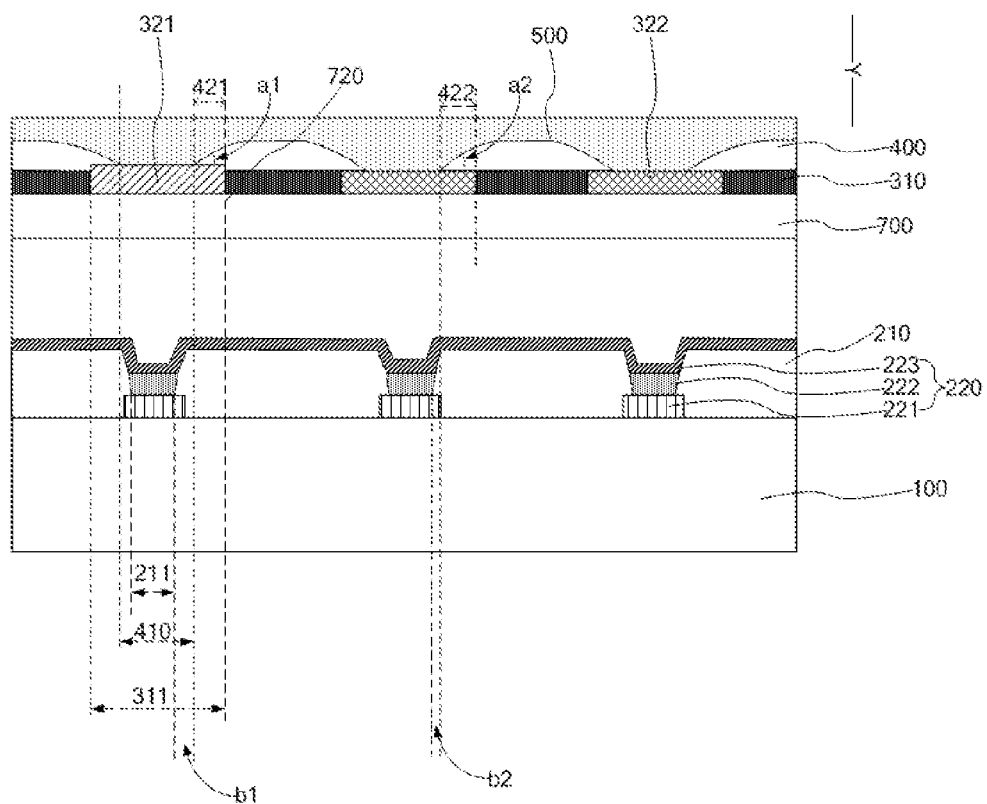
FIG. 19 is a schematic structural diagram of a display panel according to another embodiment of the present disclosure.

As shown in FIG. 19, the contour line of the orthographic projection of the pixel opening 211 on the array substrate 100 according to the embodiment of the present disclosure is within the contour line of the orthographic projection of the second opening 410 on the array substrate 100.

In one embodiment, as shown in FIG. 17, the contour line of the orthographic projection of the pixel opening 211 on the array substrate 100 according to the embodiment of the present disclosure is outside the contour line of the orthographic projection of the second opening 410 on the array substrate 100.

Figure 20:
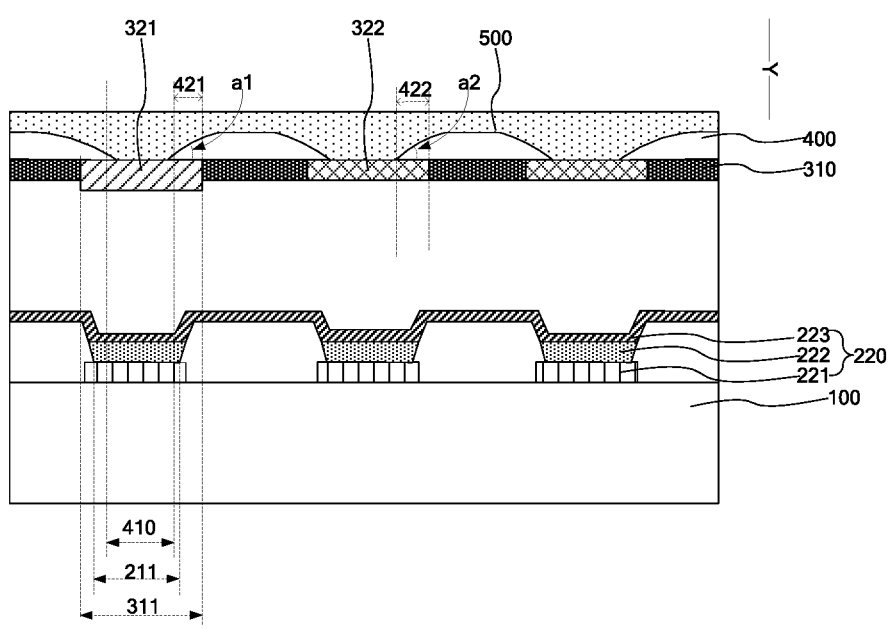
FIG. 20 is a schematic structural diagram of a display panel according to another embodiment of the present disclosure.

A display panel is further provided according to an embodiment of the present disclosure. Reference is made to FIG. 20, which is a schematic structural diagram of a display panel according to another embodiment of the present disclosure. The display panel includes an array substrate 100, a light-emitting unit layer, a filter layer and a low-refractivity layer 400.

The light-emitting unit layer is arranged on the array substrate 100. The light-emitting unit layer includes a pixel definition layer 210 and multiple light-emitting units 220. The pixel definition layer 210 is provided with multiple pixel openings 211. The multiple light-emitting units 220 are respectively arranged in the multiple pixel openings 211.

The filter layer is arranged on a side of the light-emitting unit layer which faces away from the array substrate 100. The filter layer includes a black matrix 310 and multiple color resists. The black matrix 310 is provided with multiple first openings 311. The multiple color resists are respectively arranged in the multiple first openings 311. The multiple color resists include a first color resist 321 and a second color resist 322 which is of a color different from that of the first color resist 321. A thickness of the first color resist 321 is greater than a thickness of the second color resist 322. A surface of the first color resist 321 which faces away from the array substrate 100 is aligned with a surface of the second color resist 322 which faces away from the array substrate 100.

The low-refractivity layer 400 is arranged on a side of the filter layer which faces away from the array substrate 100. The low-refractivity layer 400 is provided with multiple second openings 410. The low-refractivity layer 400 is in contact with the multiple color resists. In a first direction Y, the low-refractivity layer 400 includes a first part 421 that is overlapped with the first color resist 321 and a second part 422 that is overlapped with the second color resist 322. A bottom angle of the first part 421 adjacent to the first color resist 321 is a first angle a1. A bottom angle of the second part 422 adjacent to the second color resist 322 is a second angle a2. The first angle a1 is equal to the second angle a2.

In the first direction Y, the pixel opening 211, the first opening 311 and the second opening 410 are overlapped with each other.

The first direction Y is perpendicular to a plane where the array substrate 100 is located.

According to the embodiment of the present disclosure, the first color resist may be the red color resist and the second color resist may be at least one of the blue color resist and the green color resist. Only red light can pass through the red color resist, only blue light can pass through the blue color resist, and only green light can pass through the green color resist. The red color resist corresponds to a light-emitting unit called red light-emitting unit, the blue color resist corresponds to a light-emitting unit called blue light-emitting unit, and the green color resist corresponds to a light-emitting unit called green light-emitting unit. A thickness of the red color resist is greater than a thickness of the blue color resist, the thickness of the red color resist is greater than a thickness of the green color resist, and the thickness of the blue color resist may be equal to the thickness of the green color resist.

According to the embodiments of the present disclosure, the first angle is configured to be equal to the second angle, and the surface of the first color resist which faces away from the array substrate is aligned with the surface of the second color resist which faces away from the array substrate, so that the increments of light-emitting efficiency of the display panel at the first color resist and at the second color resist are substantially the same (for example, a difference between the increments of light-emitting efficiency of the display panel at the first color resist and at the second color resist ranges from −1% to 1%, inclusive), to avoid color deviation in light-emitting when the display panel operates, improving the light-emitting effect of the display panel, and achieving a better display effect of the display panel.

In addition, a display device is further provided according to an embodiment of the present disclosure. The display device includes the display panel according to any one of the embodiments described above.

Figure 21:
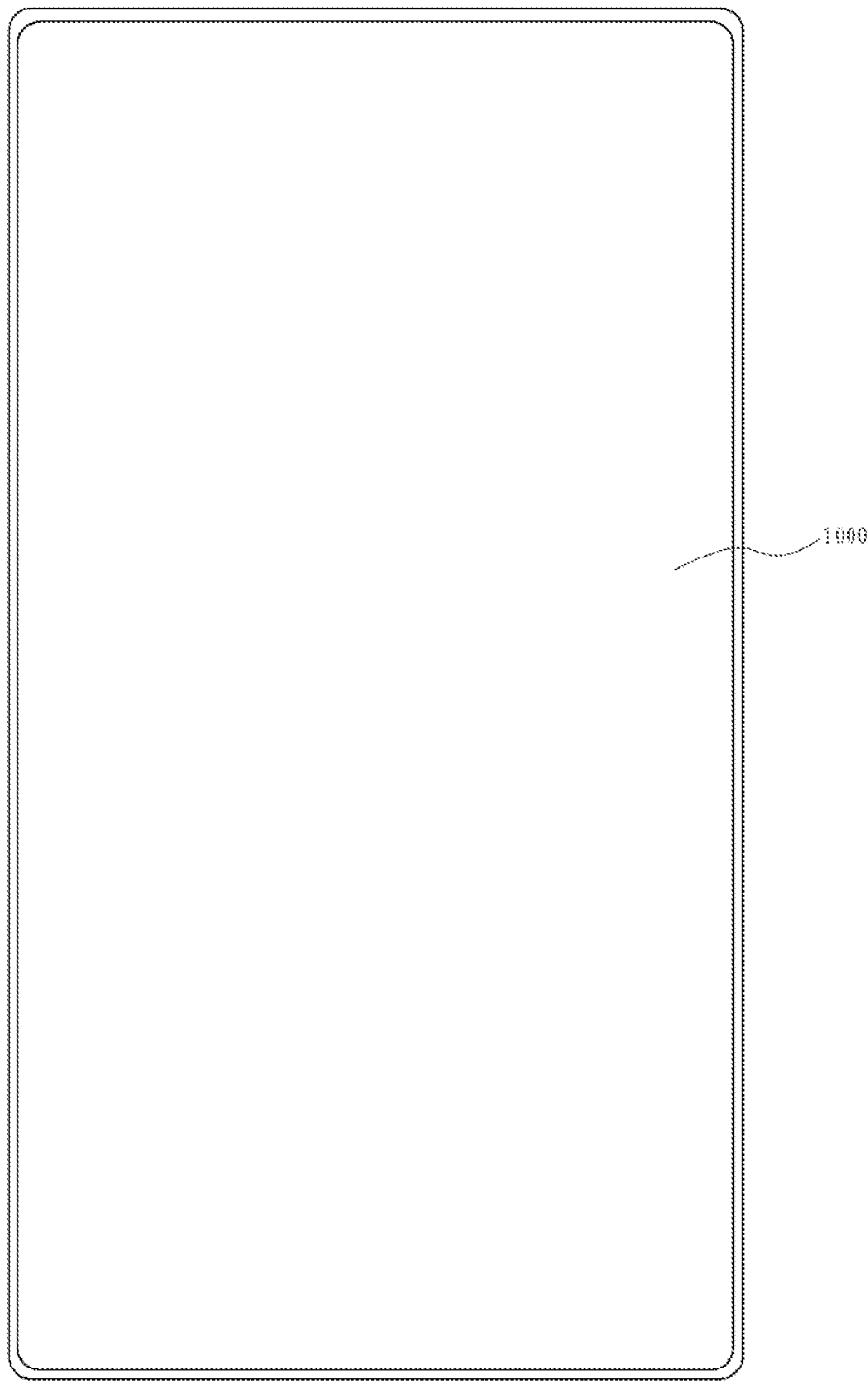
FIG. 21 is a schematic structural diagram of a display device according to an embodiment of the present disclosure.

Reference is made to FIG. 21, which is a schematic structural diagram of a display device according to an embodiment of the present disclosure. A display device 1000 according to an embodiment of the present disclosure may be a mobile terminal device.

In another embodiment of the present disclosure, the display device according to the present disclosure may, in one embodiment, be an electronic display device such as a computer and an vehicle-carried terminal, which is not limited in the present disclosure.

A display panel and a display device are provided according to the embodiments of the present disclosure. The display panel includes: an array substrate; a light-emitting unit layer arranged on the array substrate, where the light-emitting unit layer includes a pixel definition layer and multiple light-emitting units, the pixel definition layer is provided with multiple pixel openings, and the multiple light-emitting units are respectively arranged in the multiple pixel openings; a filter layer arranged on a side of the light-emitting unit layer which faces away from the array substrate, where the filter layer includes a black matrix and multiple color resists, the black matrix is provided with multiple first openings, the multiple color resists are respectively arranged in the multiple first openings, the multiple color resists include a first color resist and a second color resist which is of a color different from that of the first color resist, and a thickness of the first color resist is greater than a thickness of the second color resist; and a low-refractivity layer arranged on a side of the filter layer which faces away from the array substrate, where the low-refractivity layer is provided with multiple second openings, and the low-refractivity layer is in contact with the multiple color resists. In a first direction, the low-refractivity layer includes a first part that is overlapped with the first color resist and a second part that is overlapped with the second color resist. A bottom angle of the first part adjacent to the first color resist is a first angle. A bottom angle of the second part adjacent to the second color resist is a second angle. The first angle is different from the second angle. In the first direction, the pixel opening, the first opening and the second opening are overlapped with each other. The first direction is perpendicular to a plane where the array substrate is arranged.

It can be seen that in the embodiments of the present disclosure, the first angle is configured to be different from the second angle, to optimize the bottom angles of the low-refractivity layer at the first color resist and the second color resist that have different thicknesses, so that so that the increments of light-emitting efficiency of the display panel at the first color resist and at the second color resist are substantially the same, to avoid color deviation in light-emitting when the display panel operates, improving the light-emitting effect of the display panel, and achieving a better display effect of the display panel.

What is claimed is:

1. A display panel comprising:
    a filter layer, wherein the filter layer comprises a black matrix and a plurality of color resists, the black matrix is provided with a plurality of first openings, the plurality of color resists are respectively arranged in the plurality of first openings, the plurality of color resists comprise a first color resist and a second color resist which is of a color different from a color of the first color resist, and a thickness of the first color resist is greater than a thickness of the second color resist; and
    a low-refractivity layer, wherein the low-refractivity layer is provided with a plurality of second openings, the low-refractivity layer is in contact with the plurality of color resists, the low-refractivity layer comprises a first part that is overlapped with the first color resist and a second part that is overlapped with the second color resist, a bottom angle of the first part adjacent to the first color resist is a first angle, a bottom angle of the second part adjacent to the second color resist is a second angle, and the first angle is different from the second angle.

2. The display panel according to claim 1, further comprising:
    an array substrate; and
    a light-emitting unit layer arranged on the array substrate, wherein the light-emitting unit layer comprises a pixel definition layer and a plurality of light-emitting units, the pixel definition layer is provided with a plurality of pixel openings, and the plurality of light-emitting units are respectively arranged in the plurality of pixel openings;
    wherein:
    the filter layer is arranged on a side of the light-emitting unit layer which faces away from the array substrate,
    the low-refractivity layer is arranged on a side of the filter layer which faces away from the array substrate, and
    in a first direction, a pixel opening of the plurality of pixel openings, a first opening of the plurality of first openings and a second opening of the plurality of second openings are overlapped with each other, and the first direction is perpendicular to the array substrate.

3. The display panel according to claim 2, further comprising a high-refractivity layer arranged on a side of the low-refractivity layer which faces away from the array substrate, wherein
    the high-refractivity layer covers the low-refractivity layer and is in contact with the low-refractivity layer; and
    a refractive index of the high-refractivity layer is greater than a refractive index of the low-refractivity layer.

4. The display panel according to claim 1, wherein a thickness of the first part is less than a thickness of the second part.

5. The display panel according to claim 4, wherein the first angle and the second angle satisfy conditions that:
    the first angle is greater than the second angle, and the first angle is less than or equal to a boundary angle; or
    the first angle is less than the second angle, and the first angle is greater than or equal to the boundary angle.

6. The display panel according to claim 5, wherein in a case that a bottom angle of the low-refractivity layer adjacent to a corresponding one of the plurality of color resists is equal to the boundary angle, an increment of light-emitting efficiency of the display panel at the corresponding one of the plurality of color resists is at a maximum.

7. The display panel according to claim 6, wherein the boundary angle is 55°.

8. The display panel according to claim 1, wherein the first color resist is a red color resist and the second color resist is at least one of a blue color resist and a green color resist.

9. The display panel according to claim 2, wherein the display panel comprises a display region, the display region comprises a first area and a second area;
    the display panel further comprises a thin film packaging layer, and the thin film packaging layer is arranged between the light-emitting unit layer and the filter layer;
    a thickness of the thin film packaging layer in the first area is greater than a thickness of the thin film packaging layer in the second area;
    a thickness of a first color resist arranged in the first area is less than a thickness of a first color resist arranged in the second area; and
    a thickness of a second color resist arranged in the first area is less than a thickness of a second color resist arranged in the second area.

10. The display panel according to claim 9, wherein in the first area, the first angle and the second angle satisfy conditions that:
    the first angle is greater than the second angle, and the first angle is less than or equal to a boundary angle; or the first angle is less than the second angle, and the first angle is greater than or equal to the boundary angle;
    in the second area, the first angle and the second angle satisfy conditions that:
    the first angle is greater than the second angle, and the first angle is less than or equal to the boundary angle; or, the first angle is less than the second angle, and the first angle is greater than or equal to the boundary angle; and
    in the first area, an absolute value of a difference between the first angle and the boundary angle is a first difference; in the second area, an absolute value of a difference between the first angle and the boundary angle is a second difference; and the first difference is greater than the second difference.

11. The display panel according to claim 2, further comprising an outer insulation layer arranged between the light-emitting unit layer and the filter layer; wherein
    the outer insulation layer comprises a convex part corresponding to the second color resist.

12. The display panel according to claim 11, wherein
a surface of the first color resist which faces away from the array substrate is aligned with a surface of the second color resist which faces away from the array substrate.

13. The display panel according to claim 12, further comprising:
a thin film packaging layer arranged between the light-emitting unit layer and the filter layer;
a touch electrode layer arranged on a side of the thin film packaging layer which faces away from the array substrate, wherein the touch electrode layer comprises a plurality of touch electrodes; and
the outer insulation layer arranged on a side of the touch electrode layer which faces away from the array substrate.

14. The display panel according to claim 13, wherein
the thin film packaging layer comprises a first inorganic layer, an organic layer and a second inorganic layer that are sequentially stacked in a direction from the array substrate to the filter layer.

15. The display panel according to claim 2, wherein
a spacing between a contour line of an orthographic projection of the second opening on the array substrate and a contour line of an orthographic projection of the pixel opening on the array substrate is a reference spacing,
the reference spacing corresponding to the first part is a first reference spacing, the reference spacing corresponding to the second part is a second reference spacing, and the first reference spacing is different from the second reference spacing.

16. The display panel according to claim 15, wherein
the first reference spacing is less than the second reference spacing.

17. The display panel according to claim 2, wherein
a contour line of an orthographic projection of the pixel opening on the array substrate is outside a contour line of an orthographic projection of the second opening on the array substrate.

18. The display panel according to claim 1, wherein
the thickness of the first color resist is greater than a thickness of the black matrix.

19. A display panel comprising:
an array substrate;
a light-emitting unit layer arranged on the array substrate, wherein the light-emitting unit layer comprises a pixel definition layer and a plurality of light-emitting units, the pixel definition layer is provided with a plurality of pixel openings, and the plurality of light-emitting units are respectively arranged in the plurality of pixel openings;
a filter layer arranged on a side of the light-emitting unit layer which faces away from the array substrate, wherein the filter layer comprises a black matrix and a plurality of color resists, the black matrix is provided with a plurality of first openings, the plurality of color resists are respectively arranged in the plurality of first openings, the plurality of color resists comprise a first color resist and a second color resist which is of a color different from a color of the first color resist, a thickness of the first color resist is greater than a thickness of the second color resist, and a surface of the first color resist which faces away from the array substrate is aligned with a surface of the second color resist which faces away from the array substrate; and
a low-refractivity layer arranged on a side of the filter layer which faces away from the array substrate, wherein the low-refractivity layer is provided with a plurality of second openings, the low-refractivity layer is in contact with the plurality of color resists, the low-refractivity layer comprises a first part that is overlapped with the first color resist and a second part that is overlapped with the second color resist in a first direction, a bottom angle of the first part adjacent to the first color resist is a first angle, a bottom angle of the second part adjacent to the second color resist is a second angle, and the first angle is equal to the second angle, wherein
in the first direction, a pixel opening of the plurality of pixel openings, the first opening and the second opening are overlapped with each other; and
the first direction is perpendicular to the array substrate.

20. A display device comprising a display panel, wherein the display panel comprises:
a filter layer, wherein the filter layer comprises a black matrix and a plurality of color resists, the black matrix is provided with a plurality of first openings, the plurality of color resists are respectively arranged in the plurality of first openings, the plurality of color resists comprise a first color resist and a second color resist which is of a color different from a color of the first color resist, and a thickness of the first color resist is greater than a thickness of the second color resist; and
a low-refractivity layer, wherein the low-refractivity layer is provided with a plurality of second openings, the low-refractivity layer is in contact with the plurality of color resists, the low-refractivity layer comprises a first part that is overlapped with the first color resist and a second part that is overlapped with the second color resist, a bottom angle of the first part adjacent to the first color resist is a first angle, a bottom angle of the second part adjacent to the second color resist is a second angle, and the first angle is different from the second angle.

* * * * *